(12) United States Patent
Takatsuka et al.

(10) Patent No.: US 6,501,693 B2
(45) Date of Patent: Dec. 31, 2002

(54) SEMICONDUCTOR MEMORY DEVICE ALLOWING EASY CHARACTERISTICS EVALUATION

(75) Inventors: Takafumi Takatsuka, Hyogo (JP); Masaki Tsukude, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,874

(22) Filed: Nov. 13, 2001

(65) Prior Publication Data

US 2002/0176295 A1 Nov. 28, 2002

(30) Foreign Application Priority Data

May 28, 2001 (JP) ........................................ 2001-158358

(51) Int. Cl.[7] .............................................. G11C 29/00
(52) U.S. Cl. ...................... 365/201; 365/194; 365/233; 365/222
(58) Field of Search ................................. 365/201, 194, 365/233, 222, 205, 230.06, 189.05, 230.08

(56) References Cited

U.S. PATENT DOCUMENTS 5,396,464 A * 3/1995 Slemmer ............... 365/189.01

OTHER PUBLICATIONS

K. Sawada, et al., "A 30-µA Data–Retention Pseudostatic RAM with Virtually Static RAM Mode," IEEE Journal of Solid–State Circuits, vol. 23, No. 1, Feb. 1998, pp. 12–19.

* cited by examiner

Primary Examiner—David Nelms
Assistant Examiner—David Lam
(74) Attorney, Agent, or Firm—McDermott, Will & Emery

(57) ABSTRACT

A row control circuit includes a selector for outputting, as a signal ZRXTRSTD, either signal INTSIG or ZRXTRST in accordance with a test signal TEST, and a holding circuit for receiving a signal ZRXTS by an input A, receiving the signal ZRXTRSTD by an input B, and outputting a word line activating signal RXT from an output node OUT. In a test mode, the phase relation of a sense amplifier activating signal S0N and the word line active signal RXT is set to be different from that in a normal mode. Consequently, a margin of a timing of reading operation or restoring operation can be evaluated.

7 Claims, 10 Drawing Sheets

SEMICONDUCTOR MEMORY DEVICE ALLOWING EASY CHARACTERISTICS EVALUATION

BACKGROUND OF THE INVENTION

1. Field of the Invention

The present invention relates to a semiconductor memory device and, more particularly, to a semiconductor memory device characterized in that a part of basic timings of operations of an internal memory cell array is asynchronous with the outside.

2. Description of the Background Art

In recent years, a memory of a large capacity is in demand conspicuously as a portable electronic device such as a portable telephone has more and more functionality.

As a memory of such a device, generally, a static random access memory (SRAM) is mainly used. In the case of realizing a memory of a large capacity by this SRAM, the cost of the memory forms a large proportion of the whole system. In order to avoid an increase in price of the device, therefore, an idea of using a dynamic random access memory (DRAM) of a low cost per unit bit of the memory in place of an SRAM has been generated.

For manufacturers of portable electronic devices each using an SRAM as a main memory of a system, it is difficult to newly assemble a control circuit of a refreshing operation into the system. Consequently, manufacturers have been being developing a new memory using a memory cell that is used in a dynamic random access memory but capable of transmitting/receiving data to/from the outside by a control similar to that of an SRAM.

To be specific, the memory is characterized in that a dynamic memory cell as employed in a DRAM is used as an internal memory cell, an external interface substantially the same as that in an SRAM is used, refreshing operation is controlled internally by the chip itself, and refreshing control does not have to be particularly performed from the outside.

In the specification, in the connection with the function, such a memory will be called a DRAM with a complete hidden refresh function.

FIG. 8 is a block diagram showing the configuration of a conventional DRAM 501 with the complete hidden refresh function.

Referring to FIG. 8, DRAM 501 with the complete hidden refresh function includes: an input terminal group 2 for receiving controls signals /CE, /OE, /WE, /LB, and /UB; a terminal group 4 to/from which data signals DQ0 to DQ7 are input/output; a terminal group 6 to/from which data signals DQ8 to DQ15 are input/output; a terminal group 8 to which address signals A0 to An are input; a power supply terminal 10 to which a source potential VCC is supplied; and a ground terminal 12 to which a ground voltage GND is applied.

Control signal /CE is a chip enable signal for selecting DRAM 501 when DRAM 501 is accessed from the outside. Control signal /OE is an output enable signal for setting DRAM 501 into a read mode and making an output buffer active. Control signal /WE is a write enable signal for setting DRAM 501 into a write mode. Control signal /LB is a signal for making selection of inputting/outputting data from/to data terminal group 4 on a lower-bit side. Control signal /UB is a signal for making selection of inputting/outputting data from/to data terminal group 6 on an upper-bit side.

DRAM 501 further includes: a mode control circuit 14 for receiving the signals from input terminal group 2 and address signals A0 to An and detecting a refresh stop mode; a refresh trigger generating circuit 16 for generating a refresh trigger signal REFCYC in accordance with an output of mode control circuit 14; and a control clock generating circuit 522 for outputting a control clock corresponding to a predetermined operation mode to each block in accordance with the signals supplied from input terminal group 2 and refresh trigger signal REFCYC.

DRAM 501 further includes: a column address buffer 24 for receiving address signals A0 to Am (where m denotes a natural number smaller than n) and transmitting them to the inside in accordance with an output of control clock generating circuit 522; and a row address buffer 25 for receiving address signals Am+1 to An and transmitting them to the inside in accordance with an output of control clock generating circuit 522.

DRAM 501 further includes: a row decoder 26 for receiving internal address signals IAm+1 to IAn output from row address buffer 25 in accordance with an output of control clock generating circuit 522 and selecting a word line WL; a column decoder 28 for receiving internal address signals IA0 to IAm output from column address buffer 24 in accordance with an output of control clock generating circuit 522 and selecting a bit line BL; a memory cell array 32 including memory cells MC arranged in a matrix; and a sense amplifier band 30 for amplifying and reading an output of memory cell array 32. Sense amplifier band 30 includes, but not shown, a plurality of sense amplifiers and a plurality of input/output circuits.

In FIG. 8, one word line WL, one bit line BL, and one memory cell MC out of the plural memory cells MC included in memory cell array 32 are shown representatively.

DRAM 501 further includes: a lower-bit side input buffer IBL for receiving data signals DQ0 to DQ7 from terminal group 4 in accordance with a lower-bit control signal LC output from control clock generating circuit 522 and transmitting them to sense amplifier band 30; a lower-bit side output buffer OBL for receiving a signal from sense amplifier band 30 in accordance with control signal LC and outputting a data signal to terminal group 4; an upper-bit side input buffer IBU for receiving data signals DQ8 to DQ15 from terminal group 6 in accordance with an upper-bit control signal UC output from control clock generating circuit 522 and transmitting the received signals to sense amplifier band 30; and an upper-bit side output buffer OBU for outputting data read from sense amplifier band 30 to terminal group 6 in accordance with control signal UC.

Generally, in a static random access memory (SRAM), signals supplied from the outside can be easily controlled. Higher packing density of memory cells MC can be achieved by using dynamic memory cells at lower cost as compared with static memory cells. However, since dynamic memory cells hold information by charges accumulated in memory cells, refreshing operation has to be performed every predetermined period, and the control is complicated.

In DRAM 501 shown in FIG. 8, signals supplied from the outside are address signals and control signals similar to those of an SRAM. Consequently, a semiconductor memory of a large capacity, which can be easily controlled is realized by using simple controls supplied from the outside like those in an SRAM and internally using memory cells similar to those in a DRAM.

When a memory cell in the DRAM is not accessed for a predetermined period, however, refreshing is necessary. In a period of time during which an access is not made, refresh trigger generating circuit 16 instructs control clock generating circuit 522 to perform refreshing operation by signal REFCYC.

FIG. 9 is a circuit diagram showing the configuration of sense amplifier band 30 and memory cell MC in FIG. 8.

Referring to FIG. 9, sense amplifier band 30 includes an equalize circuit BEQ, a sense amplifier SAK, and a column selection gate CSG per bit lines BL and ZBL. A memory cell MC is disposed in an intersecting point between a word line WLn provided in corresponding with each memory cell row and bit line BL or ZBL. FIG. 9 shows one memory cell representatively.

Memory cell MC includes an N-channel MOS transistor MT provided between bit line ZBL and a storage node SN and having a gate connected to word line WLn, and a capacitor MQ having one end connected to storage node SN and the other end coupled to a cell plate potential.

Between bit lines BL and ZBL equalize circuit BEQ for equalizing the potential of bit line BL and that of bit line ZBL in accordance with an equalize signal BLEQ is provided.

Equalize circuit BEQ includes three transistors; N-channel MOS transistor which is made conductive according to an equalize signal BLEQ to thereby connect bit lines BL and ZBL, N-channel MOS transistor which is made conductive according to equalize signal BLEQ to couple bit line BL to an equalize potential VBL, and N-channel MOS transistor which is made conductive according to equalize signal BLEQ to couple bit line BL to equalize potential VBL.

Between bit lines BL and ZBL, sense amplifier SAK activated by transistors N3 and P3 which are made conductive according to sense amplifier activating signals S0N and /S0N, respectively, is provided.

Sense amplifier SAK includes a P-channel MOS transistor P1 and an N-channel MOS transistor N1 connected in series between nodes S2P and S2N and each having a gate connected to bit line ZBL, and a P-channel MOS transistor P2 and an N-channel MOS transistor N2 connected in series between nodes S2P and S2N and each having a gate connected to bit line BL.

A connection node of P-channel MOS transistor P1 and N-channel MOS transistor N1 is connected to bit line BL. A connection node of P-channel MOS transistor P2 and N-channel MOS transistor N2 is connected to bit line ZBL. When activated, sense amplifier SAK amplifies the potential difference between bit lines BL and ZBL.

Column selection gate CSG which is made conductive according to a column selection signal CSL generated by a column address is provided for each bit line pair. By column selection gate CSG, bit lines BL and ZBL are connected to global IO lines GIO and ZGIO via local IO lines LIO in a reading or writing mode.

A cycle time of the memory will now be described.

Similar to a DRAM with the complete hidden refresh function, there is a memory what is called a pseudo SRAM having the same control pins as those of an SRAM but not using a time division method different from a DRAM. In the DRAM with the complete hidden refresh function, since the chip itself automatically performs refreshing operation, there is a case that refreshing occurs between (reading/writing) operations. In such a case, the cycle time characteristic deteriorates as compared with a pseudo SRAM having refresh pins.

FIG. 10 is a diagram showing an example of waveforms in the case where refreshing occurs between operations.

Referring to FIG. 10, in cycle #1, operation is switched from NOP (no operation) to READ in response to the rising edge of control signal /OE. FIG. 10 shows a case where a refresh trigger pulse automatically, internally generated competes with operation READ. Operation READ is finished synchronously with the rising edge of control signal /OE and is switched to NOP. Then refreshing is performed internally after completion of operation READ.

In cycle #2, due to designation of writing, control signal /WE changes from the H level to the L level. The signal may be input when the period of refreshing automatically performed internal is finished and the operation is switched again to NOP. The cycle time is therefore limited by a total of the refresh period and the period of reading or writing operation.

In order to prevent deterioration in cycle time characteristics when the refresh competes with operation READ or WRITE, it is very effective to automatically switch the completion of a series of array operations of inactivating a word line, inactivating a sense amplifier, and equalizing the bit lines by a predetermined internally-determined delay time of the DRAM with the complete hidden refresh function without waiting for the rising edge of control signal /OE.

FIG. 11 is an operation waveform chart for explaining the operations in the case where the array operations are completed internally, automatically.

Referring to FIG. 11, in cycle #1, control signal /OE goes low and the operation is switched from NOP to READ. At this time, the refresh trigger pulse competes with the operation READ. Operation READ is switched to operation NOP after delay time TD in which the internal array operations are finished. The switch is made without waiting for the rising edge of control signal /OE. The refreshing operation is finished after delay time TD1, and the operation is switched again to NOP. Then a write instruction can be accepted from the outside. The improved cycle time characteristic as compared with the case shown in FIG. 10 is therefore achieved.

As shown in cycle #2, a writing operation WRITE starts in response to the rising edge of control signal /WE. The operation is switched to NOP after elapse of delay time TD3. The switch is also internally, automatically made without waiting for the rising edge of control signal /WE.

As described above, in the case where the array operations are automatically completed in a delay time internally determined, the array operations are performed only in the minimum time, so that the improved cycle time characteristic as compared with the case of instructing completion of the array operations from the outside is achieved. Since the array operations are internally, automatically completed, however, a problem such that it becomes very difficult to evaluate a restoring characteristic (interval in which data can be rewritten into an array in a reading mode) occurs.

FIG. 12 is an operational waveform chart for explaining the access time of the memory.

Referring to FIG. 12, the access time of the memory is determined by times T11 to T15.

Time T11 is a period of time from completion of equalize operation according to the falling edge of equalize signal BLEQ to the instance when word line WL is made active.

Time T12 is a period of time from an instance when word line WL is made active to an instance when the sense amplifier is activated synchronously with the rising edge of control signal ZS0S.

Time T13 is a period of time from an instance when the sense amplifier is activated until the word line WL is made inactive.

Time T14 is a period of time from an instance when the word line is made inactive to an instance when the sense amplifier is made inactive.

Time T15 is a period of time from an instance when the sense amplifier is made inactive to an instance when the bit line pair is equalized again.

For the sake of stable operation, the longer each of the times T11 to T15 is, the better. However, for higher processing speed of the memory, it is necessary to shorten each time as much as possible. Consequently, it is important to grasp the margin of each time of the developed memory.

In the DRAM with the complete hidden refresh function, however, as described with reference to FIG. 11, operation READ is switched in delay time TD2 internally determined. Consequently, the operation limit cannot be evaluated in accordance with the control signal supplied from the outside. Therefore, it is difficult to evaluate the characteristics of the developed memory.

SUMMARY OF THE INVENTION

An object of the invention is to provide a semiconductor memory device capable of controlling the timing of an array operation in response to a trigger signal in a test mode and easily evaluating a restoring characteristic.

The invention is directed to, in short, a semiconductor memory device having a test mode and a normal mode as operation modes, and including a memory array, a plurality of word lines, a row decoding circuit, a plurality of bit line pairs, a sense amplifier circuit, and a timing control circuit.

The memory array includes a plurality of memory cells arranged in a matrix of rows and columns. The plurality of word lines are used to select a row of memory cells. The row decoding circuit activates a word line corresponding to an address signal out of the plurality of word lines in response to a word line activating signal. The plurality of bit line pairs is provided in correspondence with columns of the memory cells. The sense amplifier circuit for amplifies data held in the plurality of memory cells read on the plurality of bit line pairs in accordance with a sense amplifier activating signal.

The timing control circuit outputs the word line activating signal and the sense amplifier activating signal in accordance with an external control signal in the normal mode. The timing control circuit makes a phase relation between the word line activating signal and the sense amplifier activating signal different from that in the normal mode and outputs the resultant phase relation in response to a timing test signal supplied from the outside in the test mode.

A main advantage of the invention is, therefore, that a margin of a timing of making the word line active or inactive and a margin of a timing of making the sense amplifier active or inactive whose operation margins cannot be recognized in the normal operation can be evaluated.

The foregoing and other objects, features, aspects, and advantages of the present invention will become more apparent from the following detailed description of the present invention when taken in conjunction with the accompanying drawings.

DESCRIPTION OF PREFERRED EMBODIMENTS

Figure 1:
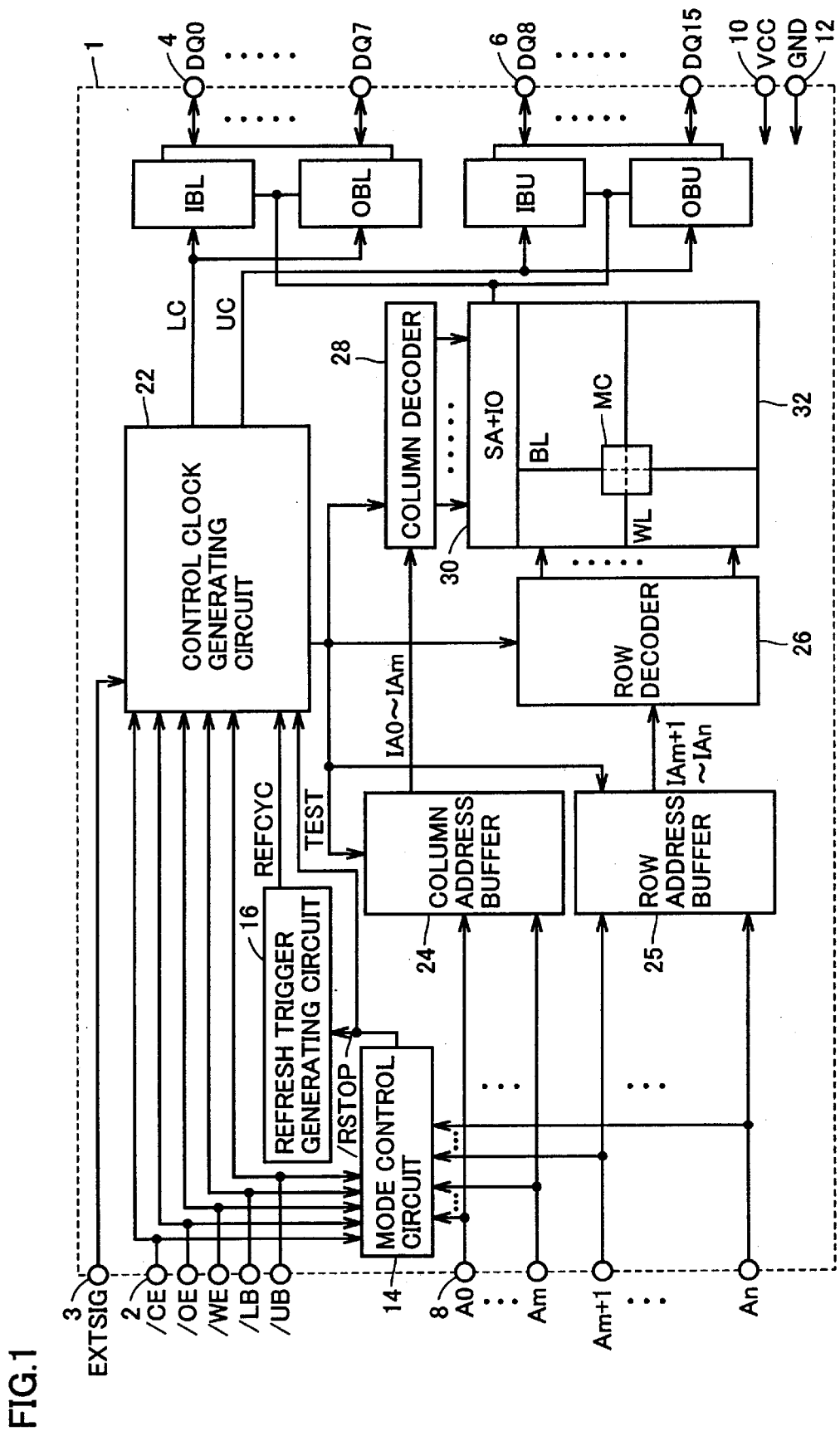
FIG. 1 is a schematic block diagram showing the configuration of a semiconductor memory device 1 according to an embodiment of the invention.

An embodiment of the invention will be described in detail hereinbelow with reference to the drawings. The same reference numerals in the drawing are given to the same or corresponding components.

FIG. 1 is a schematic block diagram showing the configuration of a semiconductor memory device 1 according to an embodiment of the invention.

Referring to FIG. 1, Semiconductor memory device 1 includes: an input terminal group 2 for receiving controls signals /CE, /OE, /WE, /LB, and /UB; a terminal group 4 to/from which data signals DQ0 to DQ7 are input/output; a terminal group 6 to/from which data signals DQ8 to DQ15 are input/output; a terminal group 8 to which address signals A0 to An are input; a power supply terminal 10 to which a source potential VCC is supplied; and a ground terminal 12 to which a ground voltage GND is applied.

Control signal /CE is a chip enable signal for selecting semiconductor memory device 1 when semiconductor memory device 1 is accessed from the outside. Control signal /OE is an output enable signal for setting semiconductor memory device 1 into a read mode and making an output buffer active. Control signal /WE is a write enable signal for setting semiconductor memory device 1 into a write mode. Control signal /LB is a signal for making a selection of inputting/outputting data from/to data terminal group 4 on a lower-bit side. Control signal /UB is a signal for making a selection of inputting/outputting data from/to data terminal group 6 on an upper-bit side.

Semiconductor memory device 1 further includes a terminal 3 to which a timing test signal EXTSIG is input from the outside. Timing test signal EXTSIG is a signal for giving an instruction of changing a timing of making an internal row control signal active or inactive from the outside in a test mode. By changing the timing of activating/inactivating the internal row control signal, the operation margin of the array can be evaluated.

Semiconductor memory device 1 further includes: a mode control circuit 14 for detecting an operation mode in accordance with address signals A0 to An and control signals /CE, /OE, /WE, /LB, and /UB, and outputting a refresh stop signal /RSTOP and a test signal TEST; and a refresh trigger generating circuit 16 for outputting a refresh trigger signal REFCYC at predetermined intervals in accordance with refresh stop signal /RSTOP.

Semiconductor memory device 1 further includes a control clock generating circuit 22 for outputting a control clock corresponding to a predetermined operation mode to each block in accordance with the signals supplied from input terminal group 2, refresh trigger signal REFCYC, timing test signal EXTSIG, and test signal TEST.

Semiconductor memory device 1 further includes: a column address buffer 24 for receiving address signals A0 to Am (where m denotes a natural number smaller than n) and transmitting them to the inside in accordance with an output of control clock generating circuit 22; and a row address buffer 25 for receiving address signals Am+1 to An and transmitting them to the inside in accordance with an output of control clock generating circuit 22.

Figure 9:
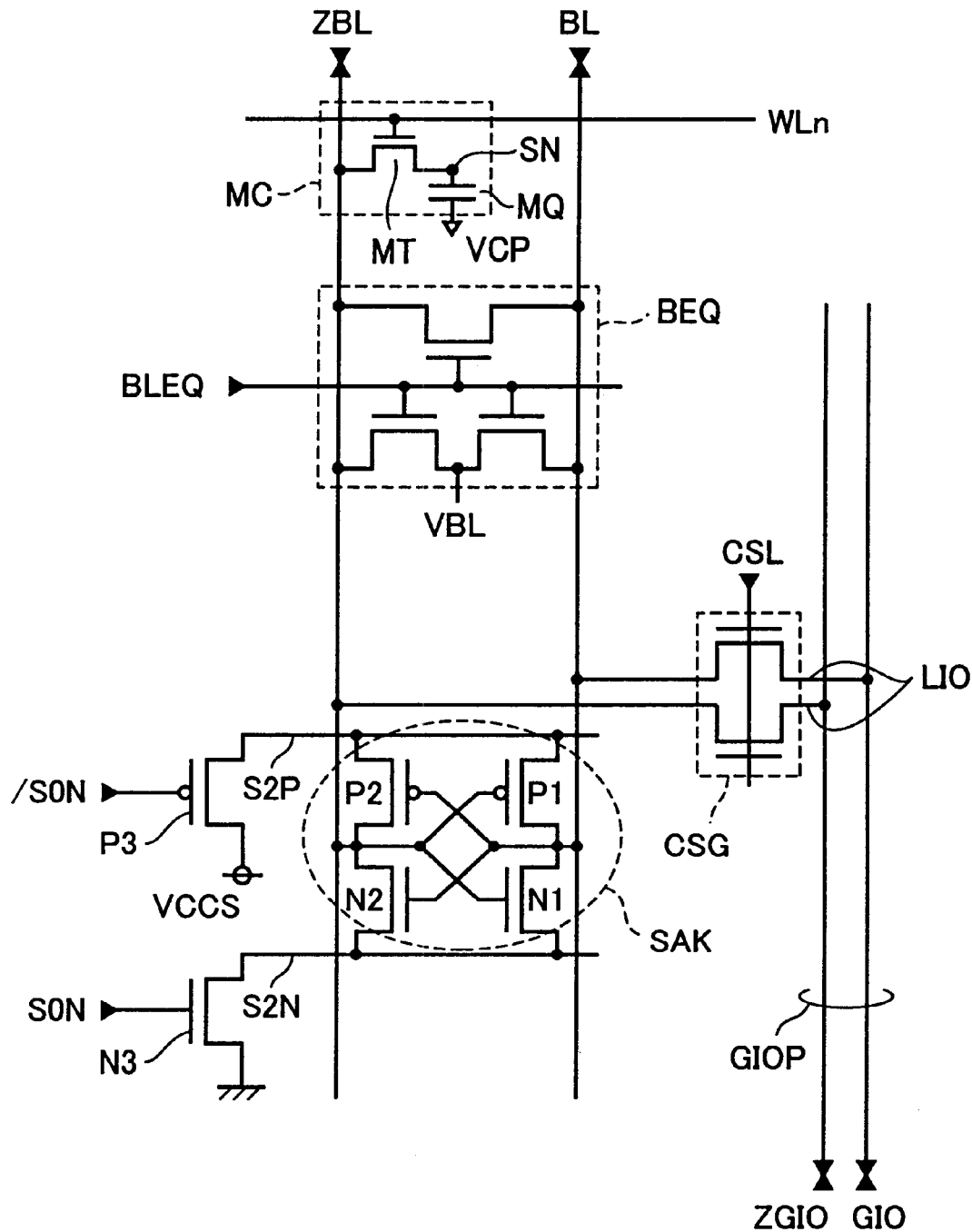
FIG. 9 is a circuit diagram showing the configuration of a sense amplifier band 30 and a memory cell MC in FIG. 8.
Figure 10:
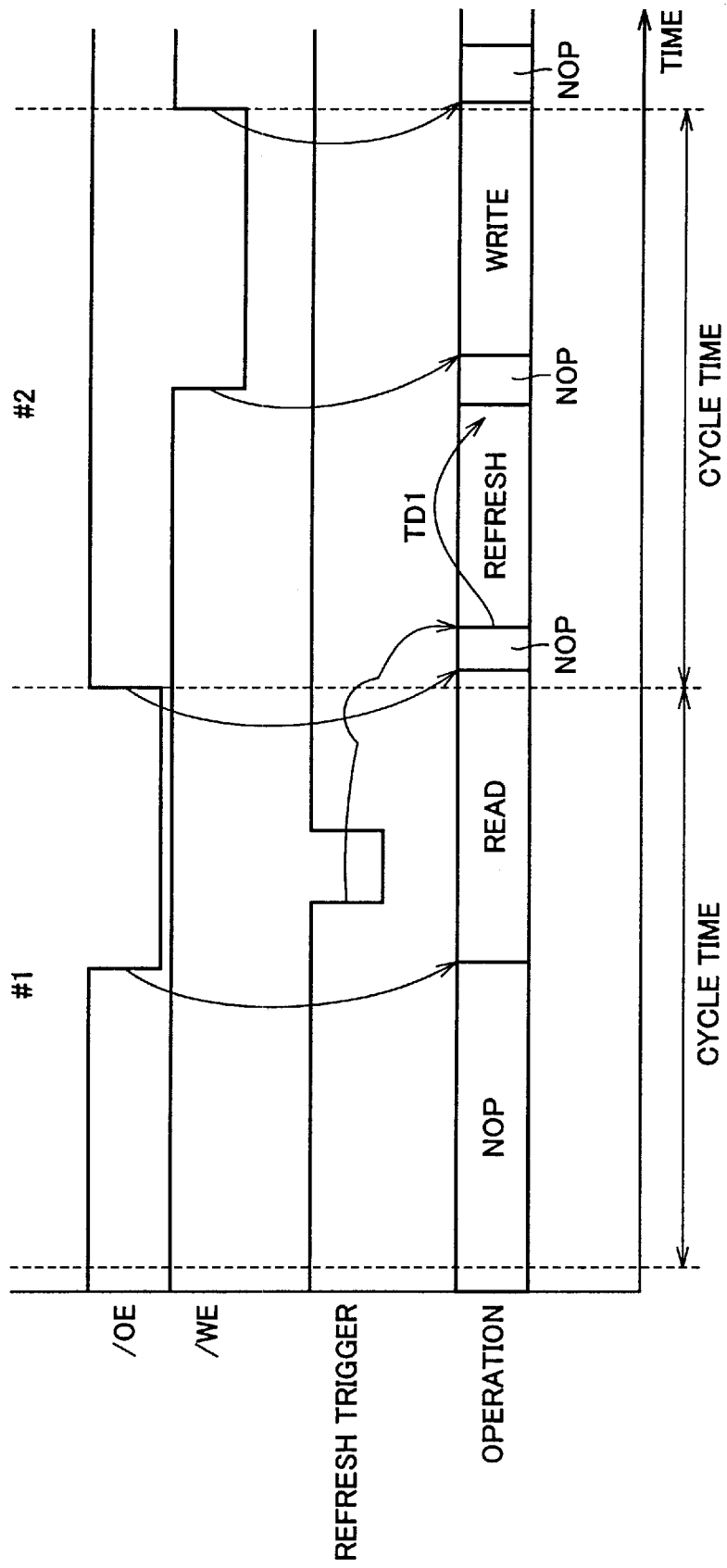
FIG. 10 is a diagram showing an example of the waveforms in the case where a refresh is made between operations.
Figure 11:
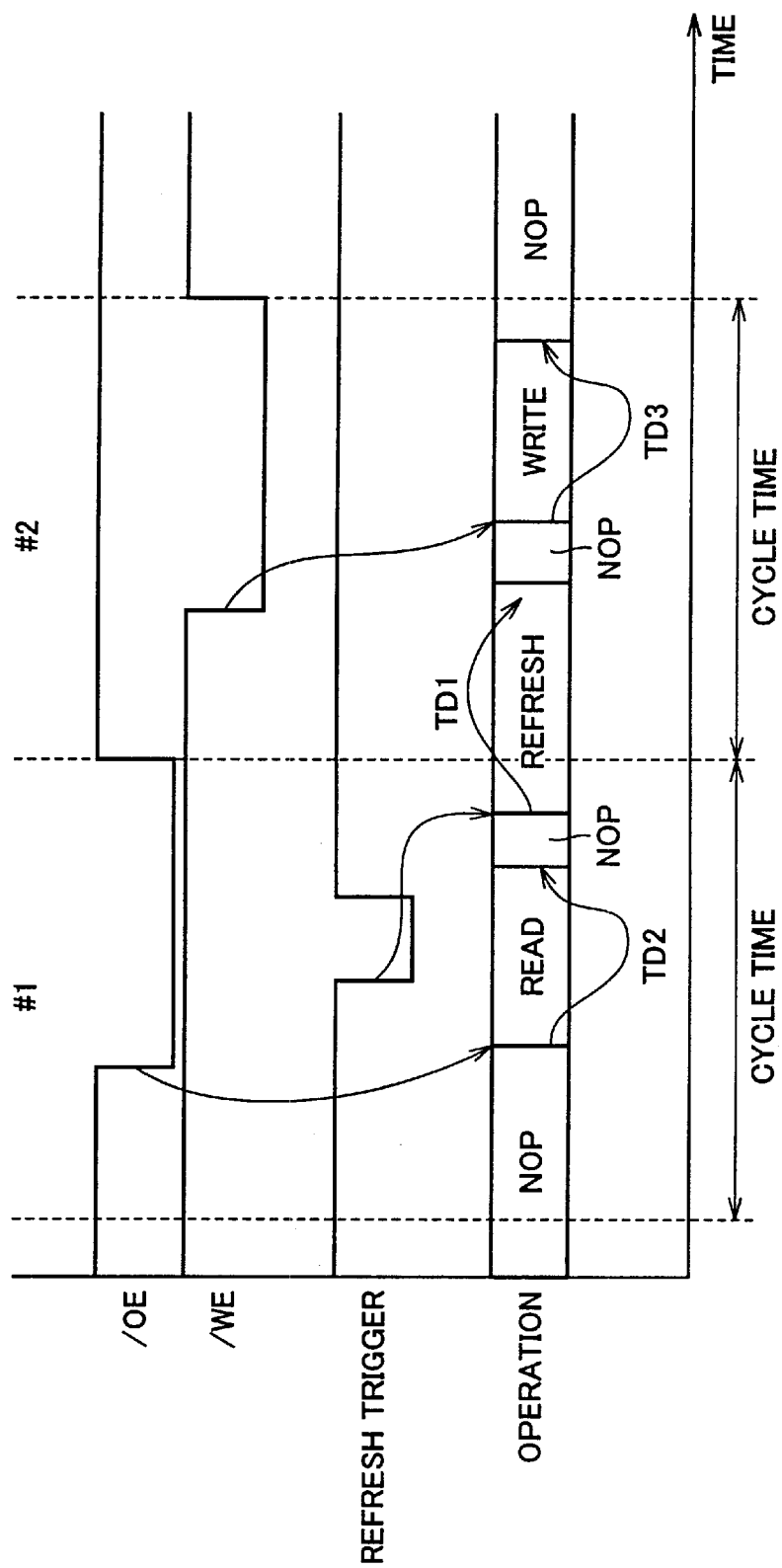
FIG. 11 is a diagram showing operation waveforms for explaining operations in the case of internally, automatically completing the array operations.
Figure 12:
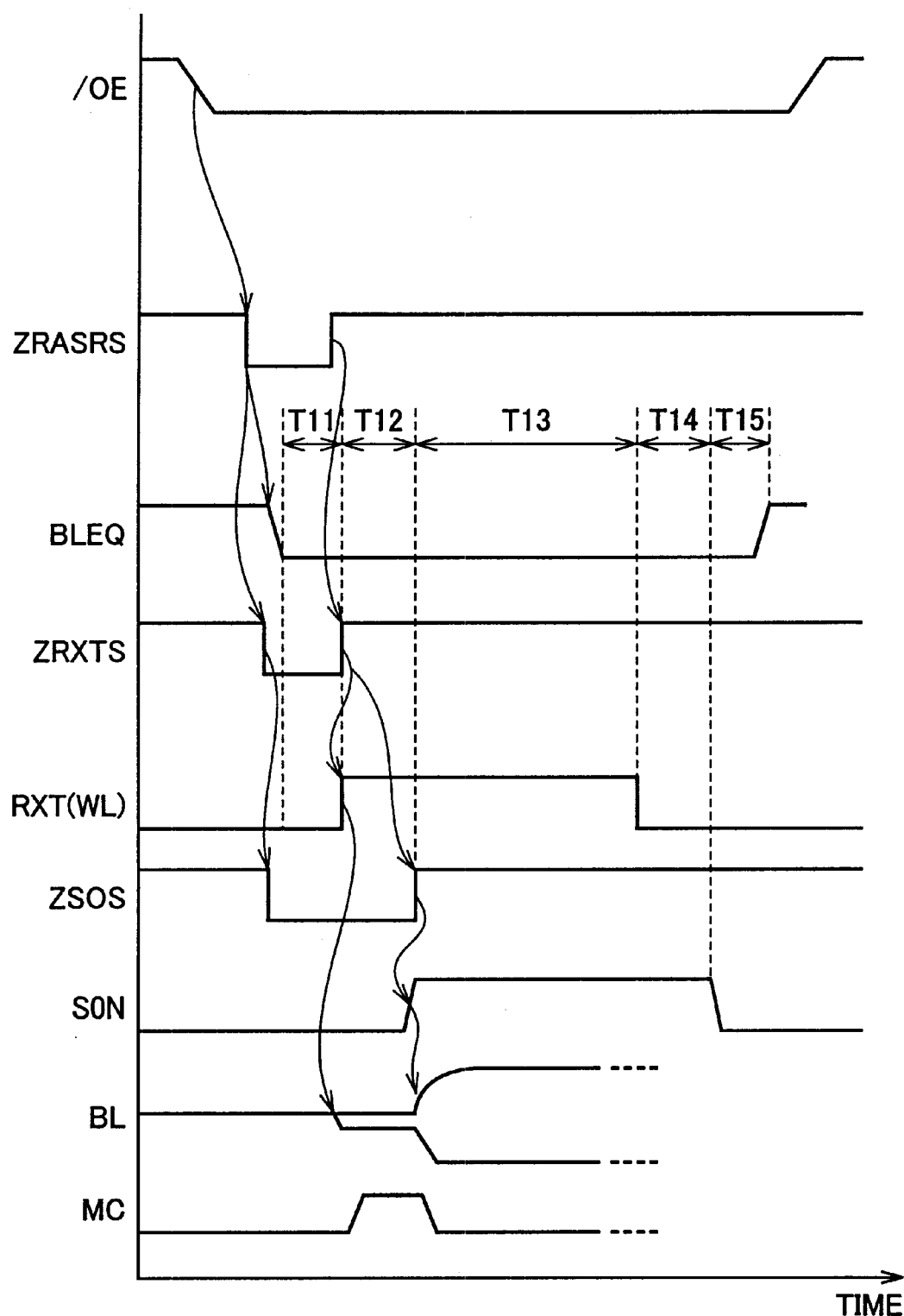
FIG. 12 is a diagram showing operation waveforms for explaining memory access time.

Semiconductor memory device 1 further includes: a row decoder 26 for receiving internal address signals IAm+1 to IAn output from row address buffer 25 in accordance with an output of control clock generating circuit 22 and selecting a word line WL; a column decoder 28 for receiving internal address signals IA0 to IAm output from column address buffer 24 in accordance with an output of control clock generating circuit 22 and selecting a bit line BL; a memory cell array 32 including memory cells MC arranged in a matrix; and a sense amplifier band 30 for amplifying an output of memory cell array 32 and reading the amplified output. Sense amplifier band 30 includes, although not shown, a plurality of sense amplifiers and a plurality of input/output circuits. Sense amplifier band 30 includes an equalize circuit BEQ, a sense amplifier SAK, and a column selection gate CSG per bit lines BL and ZBL. The configurations are similar to those shown in FIG. 9 and their description will not be repeated here.

In FIG. 1, one word line WL, one bit line BL, and one memory cell MC out of the plural memory cells MC included in memory cell array 32 are shown representatively.

Semiconductor memory device 1 further includes: a lower-bit side input buffer IBL for receiving data signals DQ0 to DQ7 from terminal group 4 in accordance with a lower-bit control signal LC output from control clock generating circuit 22 and transmitting them to sense amplifier band 30; a lower-bit side output buffer OBL for receiving a signal from sense amplifier band 30 in accordance with control signal LC and outputting a data signal to terminal group 4; an upper-bit side input buffer IBU for receiving data signals DQ8 to DQ15 from terminal group 6 in accordance with an upper-bit control signal UC output from control clock generating circuit 22 and transmitting received signals to sense amplifier band 30; and an upper-bit side output buffer OBU for outputting data read from sense amplifier band 30 to terminal group 6 in accordance with control signal UC.

Generally, in a static random access memory (SRAM), signals supplied from the outside can be easily controlled. Higher packing density of memory cells MC can be achieved by using dynamic memory cells at lower cost as compared with static memory cells. However, since dynamic memory cells hold information by charges accumulated in memory cells, refreshing operation has to be performed every predetermined period, and the control is complicated.

In semiconductor memory device 1 shown in FIG. 1, signals supplied from the outside are address signals and control signals similar to those of the SRAM. Consequently, a semiconductor memory of a large capacity, which can be easily controlled is realized by using simple controls given from the outside like an SRAM and internally using memory cells similar to those of a DRAM.

When a memory cell in the DRAM is not accessed for a predetermined period, however, refreshing is necessary. In a period of time during which an access is not made, refresh trigger generating circuit 16 instructs clock generating circuit 22 to perform refreshing operation by signal REFCYC.

Figure 2:
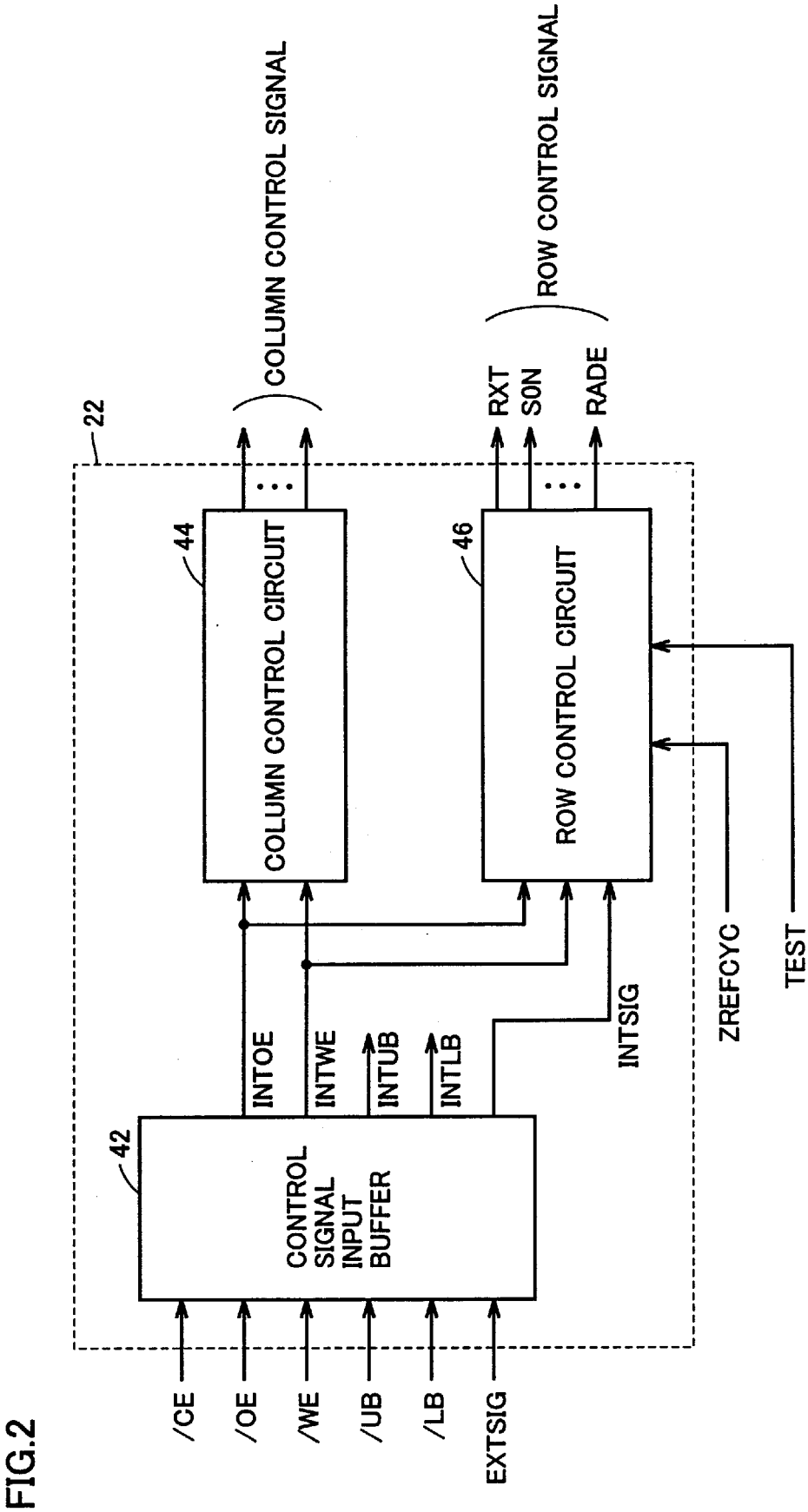
FIG. 2 is a block diagram showing the configuration of a control clock generating circuit 22 in FIG. 1.

FIG. 2 is a block diagram showing the configuration of control clock generating circuit 22 in FIG. 1.

Referring to FIG. 2, control clock generating circuit 22 includes: a control signal input buffer 42 for receiving control signals /CE, /OE, /WE, /UB, and /LB and timing test signal EXTSIG from the outside and outputting internal signals INTOE, INTWE, INTUB, INTLB, and INTSIG; a column control circuit 44 for outputting a column control signal in accordance with internal signals INTOE and INTWE; and a row control circuit 46 for outputting row control signals such as signals RXT, S0N, . . . , and RADE in accordance with internal signals INTOE, INTWE, and INTSIG and refresh trigger signal ZREFCYC. Signal RXT is a signal for determining the timing of activating a word line, signal S0N is a signal for determining the timing of activating a sense amplifier, and signal RADE is a signal for determining the timing of decoding a row address.

Figure 3:
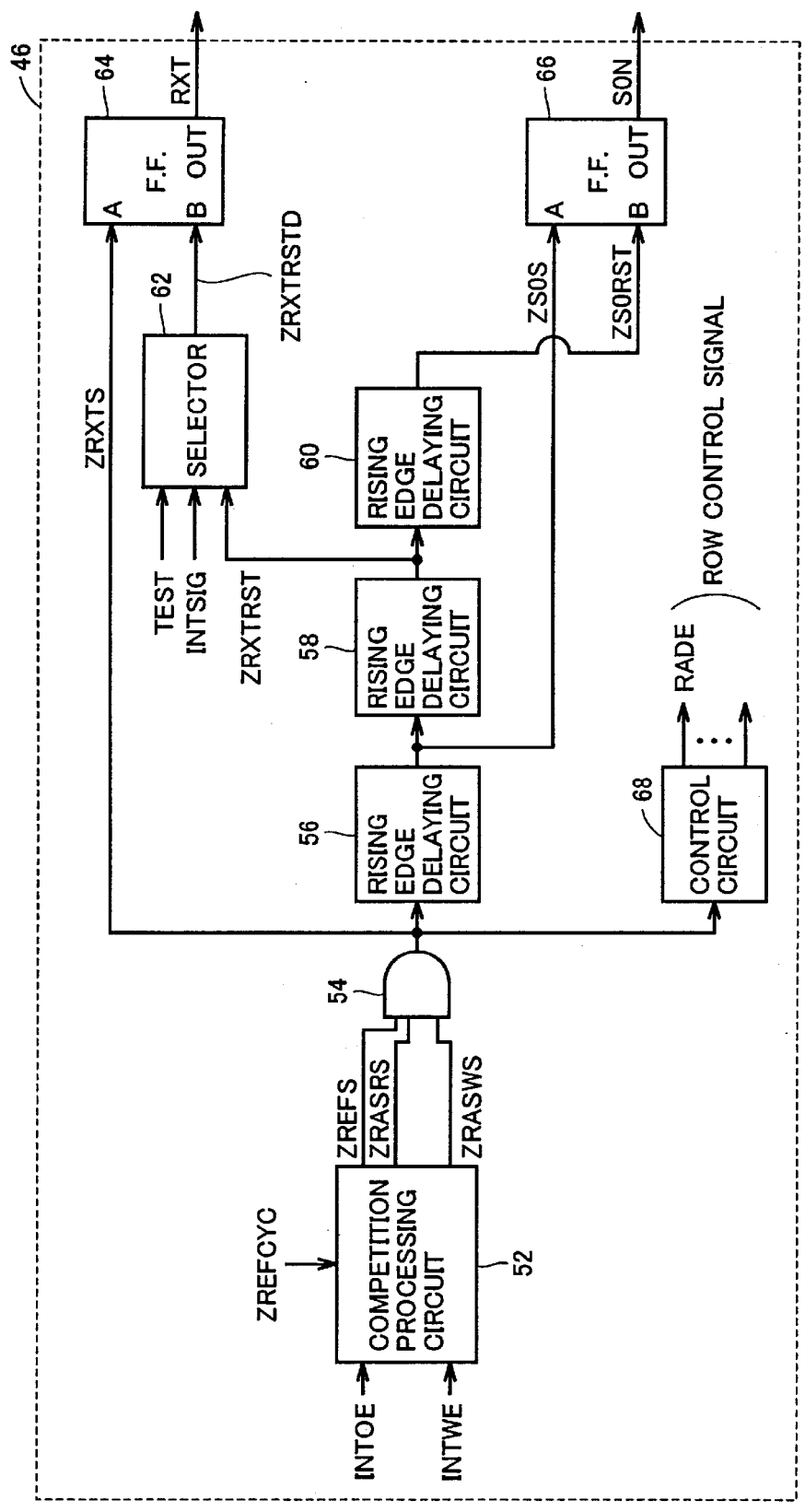
FIG. 3 is a block diagram showing the configuration of a row control circuit 46 in FIG. 2.

FIG. 3 is a block diagram showing the configuration of row control circuit 46 in FIG. 2.

Referring to FIG. 3, row control circuit 46 includes a competition processing circuit 52 for receiving internal signals INTOE and INTWE and refresh trigger signal ZREFCYC and performing a competing process between refreshing operation and reading/writing operation. Competition processing circuit 52 outputs a signal ZREFS as a one-shot pulse signal indicative of start of refreshing, a signal ZRASRS as a one-shot pulse signal indicative of start of reading operation, and a signal ZRASWS as a one-shot pulse signal indicative of start of writing operation. When internal signals INTOE and INTWE generated by trigger signals of reading/writing operations from the outside and refresh trigger signal ZREFCYC compete with each other, competition processing circuit 52 waits until an access of the reading or writing operation is finished, and outputs signal ZREFS indicative of the start of refreshing according to refresh trigger signal ZREFCYC.

Row control circuit 46 further includes an AND circuit 54 of three inputs for receiving signals ZREFS, ZRASRS, and ZRASWS and outputting signal ZRXTS; and a control circuit 68 for outputting a row control signal such as signal RADE in accordance with signal ZRXTS.

Row control circuit 46 further includes a rising edge delaying circuit 56 for receiving signal ZRXTS and outputting signal ZS0S; a rising edge delaying circuit 58 for receiving signal ZS0S and outputting a signal ZRXTRST; and a rising edge delaying circuit 60 for receiving signal ZRXTRST and outputting signal ZS0RST. Each of rising edge delaying circuits 56 to 60 delays the rising edge of the waveform of an input signal. The edge delayed by each of rising edge delaying circuits 56 to 60 indicates a reference time of activating/inactivating word line activating signal RXT and sense amplifier activating signal S0N.

Row control circuit 46 further includes: a selector 62 for outputting either signal INTSIG or ZRXTRST as a signal ZRXTRSTD in accordance with test signal TEST; a holding circuit 64 for receiving signal ZRXTS by its input A, receiving signal ZRXTRSTD by its input B, and outputting signal RXT from an output node OUT; and a holding circuit 66 for receiving signal ZS0S by its input A, receiving signal ZS0RST by its input B, and outputting signal S0N from an output node OUT. Holding circuits 64 and 66 include therein flip flops and retain an active/inactive state of signals RXT and S0N, respectively.

Figure 4:
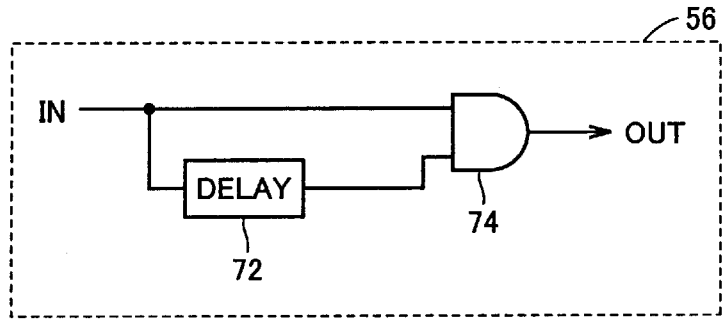
FIG. 4 is a circuit diagram showing the configuration of a rising edge delay circuit 56 in FIG. 3.

FIG. 4 is a circuit diagram showing the configuration of rising edge delay circuit 56 in FIG. 3.

Referring to FIG. 4, rising edge delay circuit 56 includes a delay circuit 72 for delaying a signal input to an input node IN; and an AND circuit 74 for receiving the signal supplied to input node IN and an output of delay circuit 72 and outputting an output signal OUT of rising edge delay circuit 56.

Each of rising edge delaying circuits 58 and 60 in FIG. 3 has a configuration similar to that of rising edge delaying circuit 56 and its description will not be repeated. Delay time of delay circuit 72 in each delay circuit is not always the same value but varies as necessary.

Figure 5:
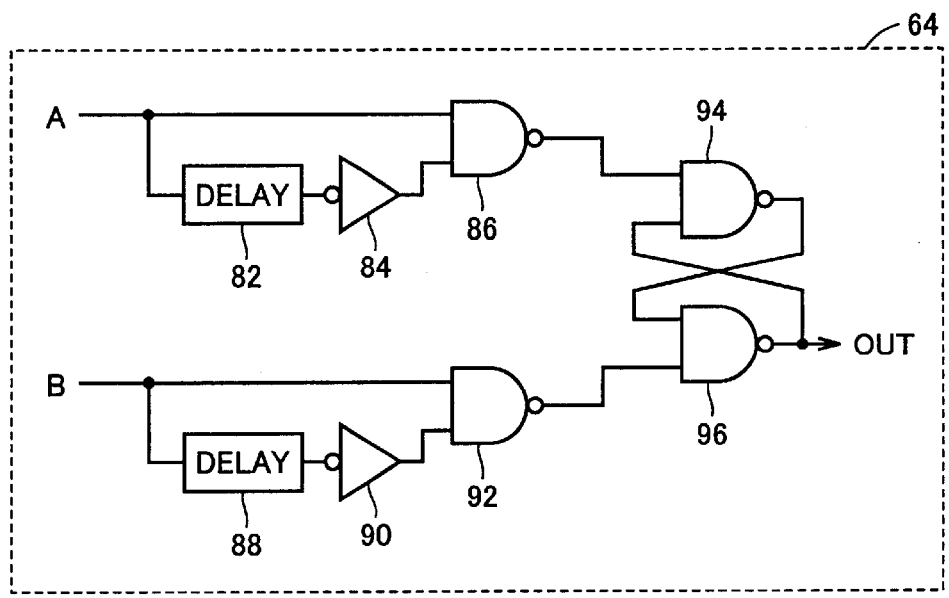
FIG. 5 is a circuit diagram showing the configuration of a holding circuit 64 in FIG. 3.

FIG. 5 is a circuit diagram showing the configuration of holding circuit 64 in FIG. 3.

Referring to FIG. 5, holding circuit 64 includes a delay circuit 82 for delaying a signal supplied to an input node A; an inverter 84 for receiving an output of delay circuit 82 and inverting it; and a NAND circuit 86 for receiving the signal supplied to input node A and an output of inverter 84. Delay circuit 82, inverter 84, and NAND circuit 86 generate pulses in accordance with the rising edge of the signal supplied to input node A.

Holding circuit 64 further includes: a delay circuit 88 for delaying a signal supplied to the input node B; an inverter 90 for receiving an output of delay circuit 88 and inverting it; and a NAND circuit 92 for receiving the signal supplied to the input node B and an output of inverter 90. Each of delay circuit 88, inverter 90, and NAND circuit 92 generates a pulse synchronously with the rising edge of the signal supplied to input node B.

Holding circuit 64 further includes a NAND circuit 94 for receiving an output of NAND circuit 86 by one of inputs, and a NAND circuit 96 for receiving outputs of NAND circuits 94 and 92. NAND circuit 96 outputs an output signal of holding circuit 64 from an output node OUT. An output of NAND circuit 96 is supplied to the other input of NAND circuit 94. NAND circuits 94 and 96 construct a fflp flop and retain the state of a signal output from output node OUT.

Since holding circuit 66 in FIG. 3 has a configuration similar to that of holding circuit 64, its description will not be repeated.

Figure 6:
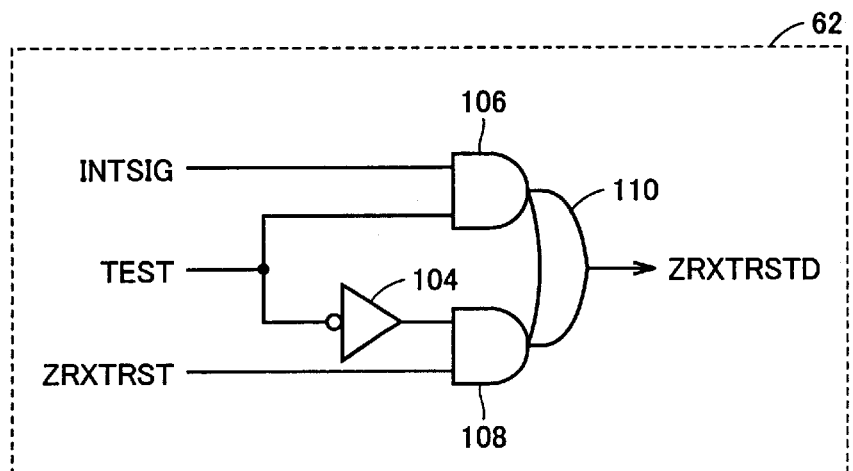
FIG. 6 is a circuit diagram showing the configuration of a selector 62 in FIG. 3.

FIG. 6 is a circuit diagram showing the configuration of selector 62 in FIG. 3.

Referring to FIG. 6, selector 62 includes: an inverter 104 for receiving and inverting test signal TEST; an AND circuit 106 for receiving test signal TEST and signal INTSIG; an AND circuit 108 for receiving an output of inverter 104 and signal ZRXTRST; and an OR circuit 110 for receiving outputs of AND circuits 106 and 108 and outputting signal ZRXTRSTD.

In normal mode in which test signal TEST is at the L level, selector 62 outputs signal ZRXTRST as signal ZRX-TRSTD.

On the other hand, in the test mode in which test signal TEST is at the H level, selector 62 outputs signal INTSIG as signal ZRXTRSTD.

Figure 7:
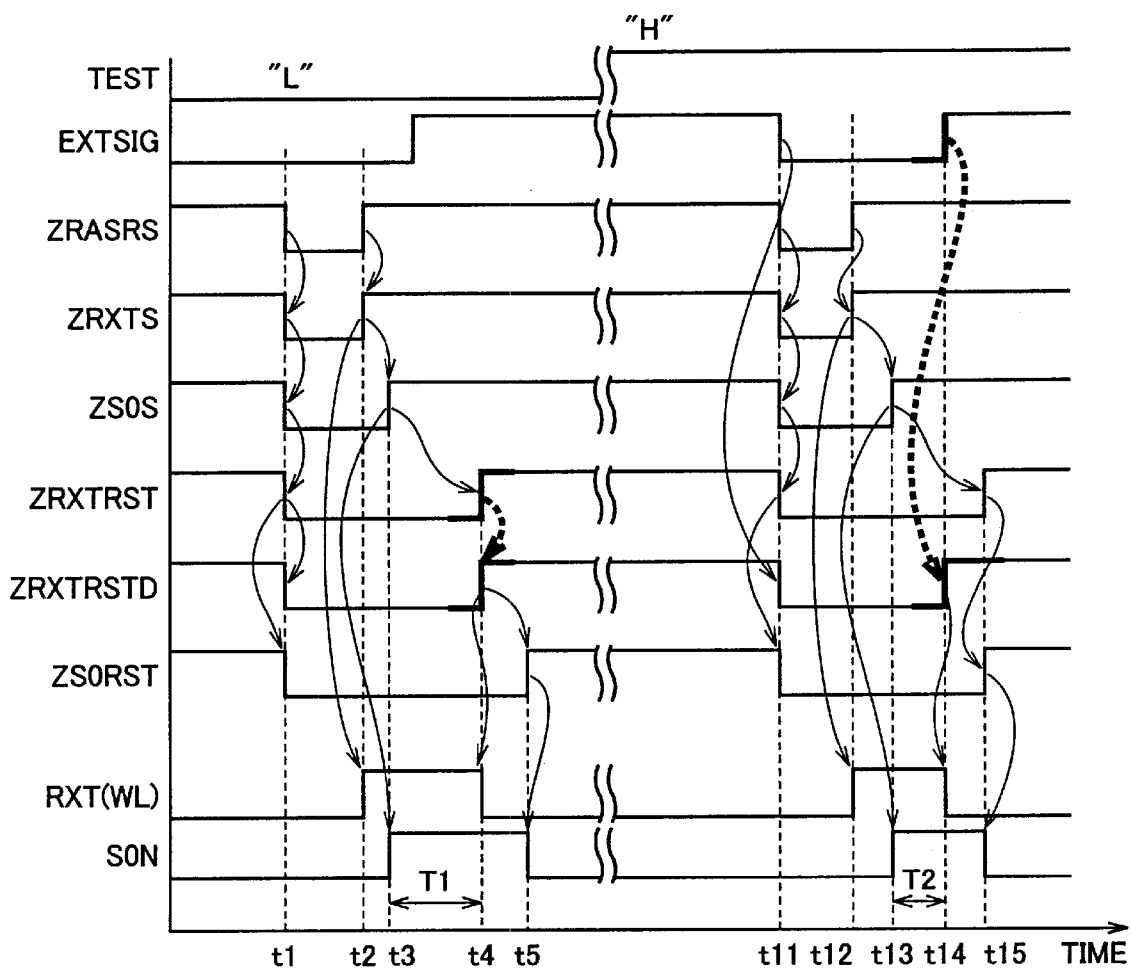
FIG. 7 is an operation waveform chart for explaining array operation in a normal mode and array operation in a test mode of semiconductor memory device 1.
Figure 8:
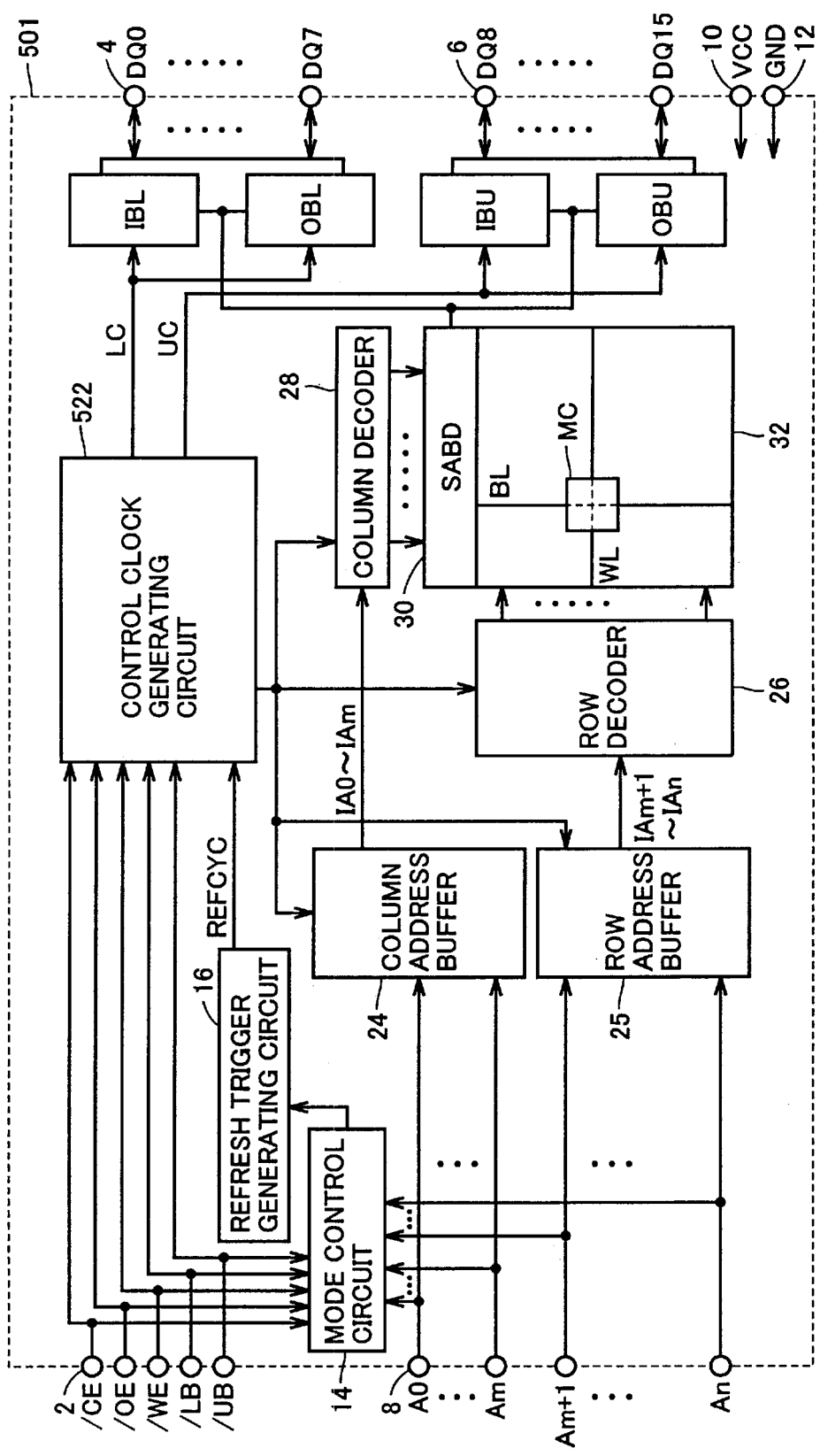
FIG. 8 is a block diagram showing the configuration of conventional DRAM 501 with the complete hidden refresh function.

FIG. 7 is an operational waveform chart for explaining the array operations in the normal mode and the array operations in the test mode of semiconductor memory device 1.

Referring to FIGS. 3 and 7, in the normal operation, test signal TEST is set at the L level. In this case, when signal ZRASRS goes down to the L level at time t1 in accordance with a signal supplied from the outside, signals ZRXTS, ZS0S, ZRXTRST, and ZRXTRSTD go down from the H level to the L level. Simultaneously with the falling edge of signal ZRXTRST, signal ZS0RST also goes down from the H level to the L level.

Subsequently, when signal ZRASRS as a one-shot pulse goes high at time t2, signal ZRXTS goes high from the L level. Since holding circuit 64 is set in an active state, signal RXT goes high from the L level, and a word line is activated.

At time t3 after elapse of delay time determined by rising edge delay circuit 56 since time t2, signal ZS0S goes high from the L level. Holding circuit 66 is then set in an active state, and signal S0N for activating the sense amplifier goes high from the L level.

At time t4 after elapse of delay time determined by rising edge delay circuit 58 since time t3, signal ZRXTRST goes high from the L level. Since test signal TEST is at the L level, selector 62 outputs signal ZRXTRST as signal ZRX-TRSTD. Therefore, even if timing test signal XTSIG supplied from the outside changes, no influence is exerted on signal ZRXTRSTD.

At time t5 after elapse of delay time determined by rising edge delay circuit 60 since time t4, signal ZS0RST goes high from the L level. Then signal S0N goes down from the H level, so that the sense amplifier is made inactive.

A case of checking an allowance in period of time T1 from time t3 at which the sense amplifier is made active to time t4 at which the word line is made inactive in the test mode will now be described.

In the test mode, test signal TEST is set to the H level by mode control circuit 14 in FIG. 1.

When signal ZRASRS goes down from the H level at time t11, in a manner similar to the case at time t1, each of signals ZRXTS, ZS0S, ZRXTRST, ZRXTRSTD, and ZS0RST goes down from the H level.

When signal ZRASRS goes high from the L level at time t12, signal ZRXTS goes high from the L level at time t12 and, accordingly, holding circuit 64 is set in the active state. Consequently, signal RXT goes high from the L level, and the word line is made active.

In a manner similar to the case at times t2 and t3, signals ZS0S and S0N change similarly.

When signal EXTSIG supplied from the outside is set to the H level from the L level at time t14, selector 62 outputs this signal as signal ZRXTRSTD in the test mode. Word line WL can be made inactive according to timing test signal EXTSIG at time t14.

At time t15, signal ZRXTRST goes high from the L level and, accordingly, signals ZS0RST and S0N change.

In such a manner, by changing the timing of the rising edge of signal EXTSIG supplied from the outside, the period of time since the sense amplifier is activated until the word line is made inactive can be changed from time T1 to time T2. Thus, since the limit of the normal reading operation can be grasped, an array read margin and a restore margin can be easily evaluated.

In the embodiment, selector 62 is provided so as to replace the timing at which signal ZRXTRST changes in FIG. 3 by a signal supplied from the outside. Similarly, by providing similar selectors for transmission paths of signals ZRXTS, ZS0S, and ZS0RST, a reset margin of the sense amplifier, a sense margin of the sense amplifier, and the like can be also easily evaluated in accordance with a signal supplied from the outside.

Although the present invention has been described and illustrated in detail, it is clearly understood that the same is by way of illustration and example only and is not to be taken by way of limitation, the spirit and scope of the present invention being limited only by terms of the appended claims.

What is claimed is:

1. A semiconductor memory device having a test mode and a normal mode as operation modes, comprising:

a memory array including a plurality of memory cells arranged in a matrix;

a plurality of word lines for selecting a row of said memory cells;

a row decoding circuit for activating a word line corresponding to an address signal out of said plurality of word lines in accordance with a word line activating signal;

a plurality of bit line pairs provided in correspondence with columns of said memory cells;

a sense amplifier circuit for amplifying data held in said plurality of memory cells read on said plurality of bit line pairs in accordance with a sense amplifier activating signal; and a timing control circuit for outputting said word line activating signal and said sense amplifier activating signal in accordance with an external control signal in said normal mode, making a phase relation between said word line activating signal and said sense amplifier activating signal different from that in said normal mode and outputting the resultant phase relation in accordance with a timing test signal supplied from the outside in said test mode.

2. The semiconductor memory device according to claim 1, wherein said timing control circuit includes a processing circuit for outputting an internal control signal having a reference edge which changes from a first logic value to a second logic value, as a timing reference of said word line activating signal and said sense amplifier activating signal, in accordance with said external control signal, a delay unit for outputting first, second, and third delay signals having edges delayed from said reference edge only by first, second, and third delay times, respectively, a first signal generating circuit for making said sense amplifier activating signal active and inactive in accordance with said first and third delay signals, respectively, and a second signal generating circuit for making said word line activating signal active and inactive in accordance with said internal control signal and said second delay signal, respectively, in said normal mode, and making said word line activating signal active and inactive in accordance with said internal control signal and said timing test signal, respectively, in said test mode.

3. The semiconductor memory device according to claim 2, wherein said second signal generating circuit includes a selector circuit for receiving said second delay signal and said timing test signal, outputting said second delay signal in said normal mode, and outputting said timing test signal in said test mode, and a holding circuit for holding said word line activating signal in an active state in accordance with said internal control signal and for holding said word line activating signal in an inactive state in accordance with an output of said selector circuit.

4. The semiconductor memory device according to claim 3, wherein said holding circuit includes a first pulse generating circuit for generating a pulse synchronously with said reference edge of said internal control signal, a second pulse generating circuit for generating a pulse synchronously with an output of said selector circuit, and p1 a flip flop circuit for setting said active state in accordance with an output of said first pulse generating circuit and resetting said active state in accordance with an output of said second pulse generating circuit.

5. The semiconductor memory device according to claim 2, wherein said delay unit includes a first delay circuit for outputting said first delay signal obtained by delaying said reference edge of said internal control signal only by said first delay time;

a second delay circuit for outputting said second delay signal obtained by delaying an edge corresponding to said reference edge of said first delay signal only by a difference between said second and first delay times; and a third delay circuit for outputting said third delay signal obtained by delaying an edge corresponding to said reference edge of said second delay signal only by a difference between said third and second delay times.

6. The semiconductor memory device according to claim 2, wherein said memory cell is a dynamic memory cell, said semiconductor device further comprises a refresh trigger generating circuit for outputting a refresh trigger signal in predetermined cycles, and said processing circuit outputs said internal control signal in response to said refresh trigger signal, and when said external control signal and said refresh trigger signal compete with each other, outputs said internal control signal according to said refresh trigger signal after an access by said external control signal is finished.

7. The semiconductor memory device according to claim 2, wherein said address signal includes a plurality of address bits, said semiconductor device further comprises:

a plurality of address input terminals each for receiving said plurality of address bits from the outside, and a column decoding circuit for selecting a column in said memory array in accordance with a part of said plurality of address bits, and said row decoding circuit activates said word line in accordance with said plurality of address bits except for said part.

* * * * *